United States Patent [19]
Kusbel et al.

[11] Patent Number: 5,721,816
[45] Date of Patent: Feb. 24, 1998

[54] ADAPTIVE RECOVERY OF READ AND WRITE ERRORS IN A DISC DRIVE

[76] Inventors: Paul F. Kusbel, 1709 Stepping Stone Trail, Edmond, Okla. 73013; John E. Moon, 5905 Burnham Pl.; Anish A. Ukani, 6833 Old Orchard La., both of Oklahoma City, Ohio 73132

[21] Appl. No.: 681,943

[22] Filed: Jul. 29, 1996

[51] Int. Cl.[6] .................................................. G06F 11/08
[52] U.S. Cl. ............... 395/182.13; 395/404; 360/77.04; 360/53; 369/32; 369/54
[58] Field of Search ......................... 395/182.13, 182.14, 395/182.17, 182.18, 404, 181; 360/31, 53, 77.04, 77.05, 77.08, 78.04; 369/32, 54, 58; 371/30, 37.8

[56] References Cited

U.S. PATENT DOCUMENTS

| | | | |
|---|---|---|---|
| 4,434,487 | 2/1984 | Rubinson et al. | 371/10.2 |
| 4,972,316 | 11/1990 | Dixon et al. | 364/200 |
| 5,189,566 | 2/1993 | Christensen et al. | 360/53 |
| 5,220,569 | 6/1993 | Hartness | 371/37.7 |
| 5,231,556 | 7/1993 | Blanks | 360/105 |
| 5,262,907 | 11/1993 | Duffy et al. | 360/77.05 |
| 5,276,662 | 1/1994 | Shaver, Jr. et al. | 369/32 |
| 5,331,476 | 7/1994 | Fry et al. | 360/53 |
| 5,386,324 | 1/1995 | Fry et al. | 360/53 |
| 5,422,760 | 6/1995 | Abbott et al. | 360/46 |
| 5,430,768 | 7/1995 | Minuhin et al. | 375/340 |
| 5,459,757 | 10/1995 | Minuhin et al. | 375/376 |

*Primary Examiner*—Robert W. Beausoliel, Jr.
*Assistant Examiner*—Dieu-Minh Le

[57] ABSTRACT

Method and apparatus for optimizing the read/write channel error recovery process in a disc drive. An error recovery table comprising a plurality of sequentially ordered corrective operations is provided so that, upon receipt of an error from the disc drive read/write channel, the corrective operations are sequentially performed in an attempt to correct the error. At such time that a selected one of the corrective operations results in the correction of the error, the table is reordered so that the selected one of the corrective operations is advanced in the table sequence, and the reordered table is used upon the occurrence of the next error. Additionally, a series of free retries is performed prior to the operation of the error recovery table.

17 Claims, 4 Drawing Sheets

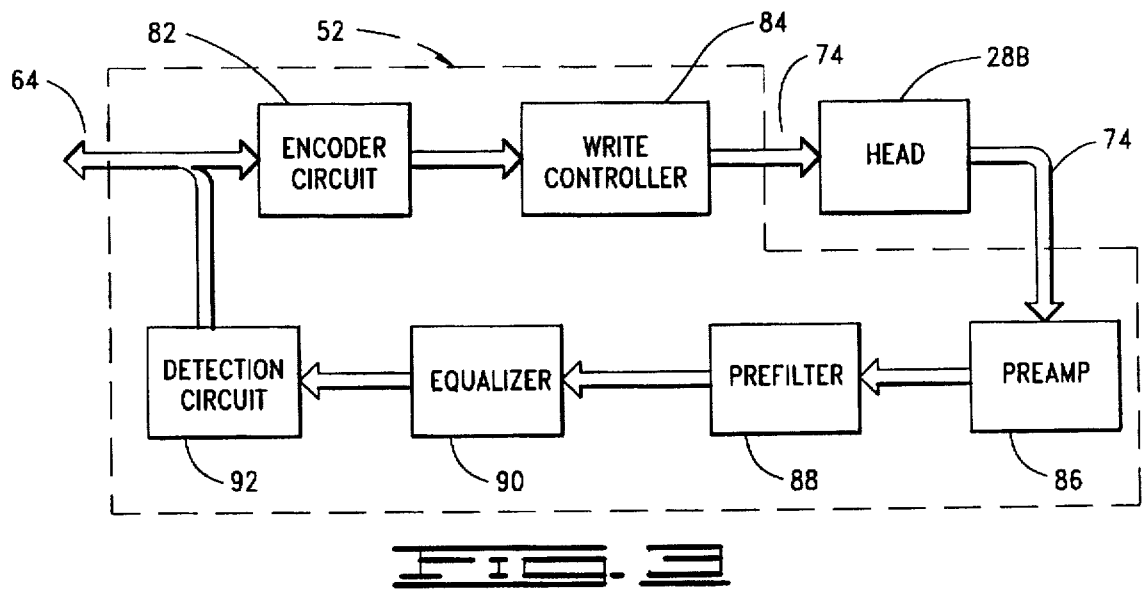

FIG. 3

| READ ERROR RECOVERY TABLE | |
|---|---|
| TABLE COUNT | CORRECTIVE OPERATION |
| 1 | SEEK AWAY |
| 2 | REREAD DATA |
| 3 | REREAD DATA |
| 4 | ADAPT READ CHANNEL |
| 5 | CHANGE ECC LEVEL |
| 6 | CHANGE ECC LEVEL |
| 7 | CHANGE ECC LEVEL |
| 8 | CHANGE ECC LEVEL |
| 9 | +6% OFF TRACK CENTER |
| 10 | +6% OFF TRACK CENTER |
| 11 | −6% OFF TRACK CENTER |
| 12 | −6% OFF TRACK CENTER |
| 13 | +12 % OFF TRACK CENTER |
| 14 | +12 % OFF TRACK CENTER |
| 15 | −12% OFF TRACK CENTER |
| 16 | −12% OFF TRACK CENTER |
| 17 | WIGGLE RETRY |

FIG. 5

| WRITE ERROR RECOVERY TABLE | |
|---|---|
| TABLE COUNT | CORRECTIVE OPERATION |
| 1 | ATTEMPT REWRITE |
| 2 | ATTEMPT REWRITE |
| 3 | ATTEMPT REWRITE |
| 4 | ATTEMPT REWRITE |
| 5 | SEEK AWAY |
| 6 | ATTEMPT REWRITE |
| 7 | ADAPT READ CHANNEL |
| 8 | ATTEMPT REWRITE |
| 9 | ATTEMPT REWRITE |
| 10 | ATTEMPT REWRITE |
| 11 | WIGGLE RETRY |
| 12 | ATTEMPT REWRITE |
| 13 | ATTEMPT REWRITE |

FIG. 7

ADAPTIVE RECOVERY OF READ AND WRITE ERRORS IN A DISC DRIVE

BACKGROUND OF THE INVENTION

1. Field of the Invention

This invention relates generally to the field of disc drive data storage devices, and more particularly, but not by way of limitation, to improved recovery from read and write errors in a disc drive.

2. Discussion

Modern hard disc drives comprise one or more rigid discs that are coated with a magnetizable medium and mounted on the hub of a spindle motor for rotation at a constant high speed. Information is stored on the discs in a plurality of concentric circular tracks by an array of transducers (heads) mounted for movement to an electronically controlled rotary actuator assembly.

The heads are mounted via flexures at the ends a plurality of arms which project radially outward from a substantially cylindrical actuator body. The actuator body is journaled via ball bearing assemblies to rotate about a pivot shaft which is mounted to the disc drive housing at a position closely adjacent the outer extreme of the discs. The pivot shaft is parallel with the axis of rotation of the spindle motor and the discs and the heads move in a plane parallel with the surfaces of the discs.

The actuator voice coil motor includes a coil mounted on the side of the actuator body opposite the head arms so as to be immersed in the magnetic field of an array of permanent magnets. When controlled DC current is passed through the coil, an electromagnetic field is set up which interacts with the magnetic field of the magnets and causes the coil to move in accordance with the well-known Lorentz relationship. As the coil moves relative to the magnets, the actuator body pivots about the pivot shaft and the heads are moved across the disc surfaces.

Typically, the heads are supported over the discs by slider assemblies which include air-bearing surfaces designed to interact with a thin layer of moving air generated by the rotation of the discs, so that the heads are said to "fly" over the disc surfaces. Generally, the heads write data to a selected data track on the disc surface by selectively magnetizing portions of the data track through the application of a time-varying write current to the head. In order to subsequently read back the data stored on the data track, the head detects flux transitions in the magnetic fields of the data track and converts these to a signal which is decoded by a read channel circuit of the disc drive. For a detailed discussion of disc drive reading and writing techniques, see U.S. Pat. No. 5,276,662 entitled DISC DRIVE WITH IMPROVED DATA TRANSFER APPARATUS, issued Jan. 4, 1994 to Shaver et al., assigned to the assignee of the present invention and incorporated herein by reference.

As will be recognized, a user file to be written to the disc is typically encoded with both run-length limited encoding, to ensure proper generation of a read clock when the data is retrieved from the disc and with ECC encoding, to detect the presence of errors in the data as it is subsequently retrieved from the disc. Even with the use of such encoding, it will be recognized that both write errors and read errors occasionally occur as large amounts of data are written to and read from the disc.

Write errors generally occur as a result of header errors, which occur when the incorrect header (sector) information is provided to the write controller, indicating the head is not over the target sector to which the data is to be written. Additionally, write errors can occur as a result of an off-track condition (i.e., the head is not correctly positioned over the selected data track) and as a result of an unsafe error condition, such as a voltage fault. When a write error occurs, the disc drive typically retries writing the data and, if the write error persists, may perform other corrective operations, such as moving the head to a track not normally used for the storage of user data and writing data at this track before returning the head to the selected track for another attempt.

Read errors, on the other hand, are typically detected as result of the operation of the ECC circuitry; particularly, modern disc drives are typically provided with the capability of "on-the-fly" correction of up to a selected number of errors in the retrieved data (as a result of the ECC encoding) and the detection of more than the selected number of errors in the retrieved data. Like write errors, when uncorrectable read errors are detected, the disc drive may reread the data and, if the read error persists, the disc drive may attempt other corrective operations, such as seeking away, which comprises moving the head away from, and then back to, the selected track and rereading the data, or modifying the channel parameters used by the read channel and rereading the data. For a discussion of ECC techniques, see U.S. Pat. No. 5,627,843 entitled CORRECTING UP TO TWO DISC DRIVE READ ERRORS AND DETECTING THE OCCURRENCE OF MORE THAN TWO READ ERRORS, issued May 6, 1997 to Deng et al., assigned to the assignee of the present invention and incorporated herein by reference.

It will be recognized that disc drives are commonly provided with a defined error recovery procedure in the event of the receipt of write and read errors, so that a predefined sequence of corrective operations is employed upon occurrence of such errors. However, such corrective operations require time to complete, undesirably slowing down the operation of the disc drive in the writing or reading of user files. Additionally, depending upon the cause of the errors, certain corrective operations are more effective than others in resolving the occurrence of the errors and allowing the operation of the disc drive to resume.

Thus, there is a need for an approved approach to the correction of read and write errors encountered by a disc drive which reduces the time required to recover from such errors and adapts to the conditions causing the read and write errors.

SUMMARY OF THE INVENTION

Accordingly, the present invention provides a method and apparatus for optimizing the read/write channel error recovery process in a disc drive.

In accordance with a preferred embodiment of the present invention, a read error recovery routine is provided in the form of programming stored in memory used by a disc drive microprocessor. Upon receipt of a read error during operation of the read/write channel, the routine performs a series of free retries wherein the data containing the read error is reread.

When the free retries are unsuccessful in correcting the read error, a read error recovery table is used, the read error recovery table comprising a plurality of sequentially ordered read error corrective operations. The corrective operations are performed sequentially in an attempt to correct the error, until the table is exhausted or until a selected one of the corrective operations corrects the error. When the table is exhausted without correction of the error, a hard error flag is set and the disc drive takes suitable actions, such as notifying the host computer of the hard error condition and marking the sector containing the hard read error. Alternatively, when a selected one of the corrective operations corrects the error, the read error recovery table is reordered so that the selected one of the corrective operations is advanced in the table. Thereafter, the reordered table is used during the read error recovery process.

Additionally, the write error recovery process likewise makes use of a write error recovery routine, wherein a series of free retries are performed wherein an attempt is made to rewrite the data to the selected sector. At such time that the free retries are unsuccessful, the routine refers to a write error recovery table, comprising a plurality of sequentially ordered write error corrective operations. When the write error recovery table is exhausted without correction of the write error, the disc drive sets a hard write error flag and takes other suitable actions. However, as with the read error recovery table, the write error recovery table is reordered when a selected one of the write error corrective operations corrects the write error.

Preferably, the corrective operations used by the read error recovery table and the write error recovery table include a seek away corrective operation, wherein a one-track seek is performed on the head and the head is then returned to the selected track containing the sector associated with the error. Additionally, the corrective operations include adaptation of the read channel and a wiggle retry wherein the head is moved to a non-user data track, selected data is written to the non-user data track, and the head is then returned to the selected track. Moreover, the read error recovery table also includes operations wherein the head is moved a selected distance off track center, the selected distance comprising a percentage of the width of the selected track.

Finally, in the preferred embodiment a selected corrective operation which results in the correction of an error is advanced one location in the associated table, although other approaches are contemplated, such as advancing the selected corrective operation to the top of the associated table.

Accordingly, an object of the present invention is to improve the recovery process used to recover from read and write errors in a disc drive.

Another object is to reduce the time associated with error recovery in the disc drive.

Yet another object is to optimize the error recovery process in accordance with the conditions causing the occurrence of the errors.

Other objects, advantages and features of the present invention will be apparent from the following description when read in conjunction with the drawings and appended claims.

BRIEF DESCRIPTION OF THE DRAWINGS

FIG. 3 is a functional block diagram of the read/write channel of the disc drive of FIG. 2.

FIG. 6 is a generalized flow chart for a WRITE ERROR RECOVERY routine performed by the system microprocessor of FIG. 2 in response to a write error reported by the read/write channel of FIG. 3.

FIG. 7 is a generalized representation of a WRITE ERROR RECOVERY TABLE utilized by the routine of FIG. 6.

DETAILED DESCRIPTION OF THE PREFERRED EMBODIMENT

Figure 1:
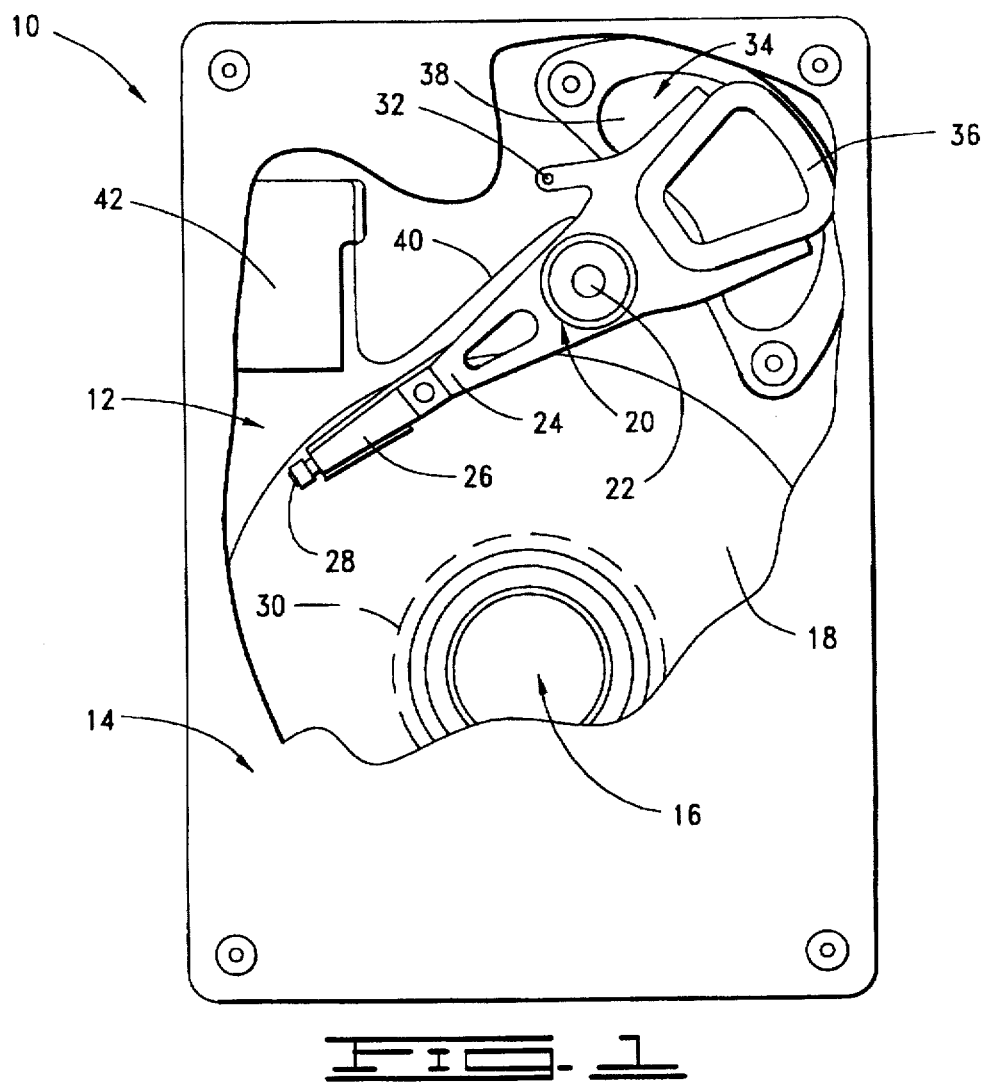
FIG. 1 is a top plan view of a disc drive in which the present invention is particularly useful.

Turning now to the drawings and more particularly to FIG. 1, shown therein is a top plan view of a disc drive 10 in which the present invention is particularly useful. The disc drive 10 includes a base deck 12 to which various disc drive components are mounted and a top cover 14, which is shown in a partial cut-away fashion to expose selected components of interest. It will be readily understood that the base deck 12 includes an interior surface to which various disc drive components are mounted, as well as side walls which, in combination with the top cover 14, provide sufficient height to house these components within a sealed internal environment.

Mounted to the base deck 12 is a spindle motor (not shown) having a rotatable spindle hub 16 to which a plurality of discs 18 are mounted for rotation at a constant high speed. Adjacent the discs 18 is an actuator assembly 20 (also referred to as an "E-block") which pivots about a pivot shaft 22 in a rotary fashion. The actuator assembly 20 includes actuator arms 24 which support gimbal assemblies 26 (also referred to as "load springs"). The load springs 26 in turn support heads 28, with each of the heads 28 corresponding to a surface of one of the discs 18. As provided hereinabove, the heads 28 are positionably located over data tracks (not shown) of the discs 18 in order to read data from and write data to the tracks, respectively. At such time that the disc drive 10 is not in use, the heads 28 are moved to landing zones (denoted at broken line 30), which are located in FIG. 1 near the inner diameter of the discs 18.

It will be recognized that the E-block 20 is provided with a latching arrangement (shown generally at 32) to secure the E-block 20 when the disc drive 10 is not in use. For a general discussion of typical E-block latching arrangements, see U.S. Pat. No. 5,231,556 entitled SELF-HOLDING LATCH ASSEMBLY, issued Jul. 27, 1993 to Blanks, assigned to the assignee of the present invention and incorporated herein by reference.

Continuing with FIG. 1, the E-block 20 is controllably positioned by way of a voice coil motor (VCM, shown generally at 34), comprising an actuator coil 36 immersed in the magnetic field generated by a permanent magnet 38. It will be recognized that a magnetically permeable flux path (such as a steel plate) is mounted above the actuator coil 36 to complete the magnetic circuit of the VCM 34, but for purposes of illustration this flux path has not been shown in FIG. 1. When controlled DC current is passed through the actuator coil 36, an electromagnetic field is set up which interacts with the magnetic circuit of the VCM 34 to cause the actuator coil 36 to move relative to the permanent magnet 38. As the actuator coil 36 moves, the E-block 20 pivots about the pivot shaft 22, causing the heads 28 to move across the surfaces of the discs 18.

To provide the requisite electrical conduction paths between the heads 28 and disc drive read/write circuitry (not shown in FIG. 1), head wires (not separately shown) are routed on the E-block 20 from the heads 28, along the gimbal assemblies 26 and the actuator arms 24, to a flex circuit assembly 40. The head wires are secured by way of a suitable soldering process to corresponding pads (not separately designated in FIG. 1) of the flex circuit assembly 40. In turn, the flex circuit assembly 40 is connected to a flex circuit bracket (shown generally at 42) in a conventional manner and communication is provided between the flex circuit bracket 42 and a printed circuit board (PCB) mounted to the underside of the disc drive 10. As will be recognized, the PCB houses the interface and control electronics for the disc drive 10.

Figure 2:
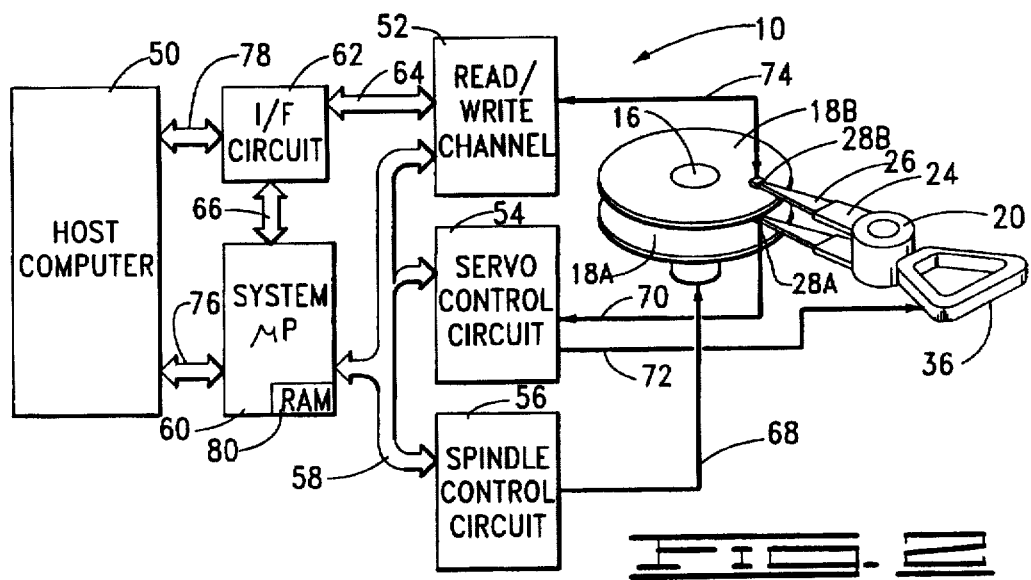
FIG. 2 is a functional block diagram of the disc drive of FIG. 1.

Referring now to FIG. 2, shown therein is a simplified functional block diagram of the disc drive 10 of FIG. 1, operably connected to a host computer 50. More particularly, FIG. 2 shows the disc drive 10 to generally comprise a read/write channel 52, a servo control circuit 54 and a spindle control circuit 56, all operably connected by way of control bus 58 to a system microprocessor 60. It will be recognized that the control bus 58 comprises the necessary connections for the system microprocessor 60 to communicate with and control these disc drive circuits. Additionally, an interface circuit 62 is shown connected to the read/write channel 52 (by way of an internal data bus 64) and to the system microprocessor 60 (by way of a control bus 66), with the interface circuit 62 serving as a data interface for the disc drive 10.

As will be recognized, the spindle control circuit 56 controls the rotational speed of the spindle hub 16 and discs 18A, 18B, as generally indicated by signal path 68. As the construction and operation of the spindle control circuit 56 are conventional, these will not be further discussed herein.

The servo control circuit 54 of FIG. 2 is shown to receive servo position information from a head 28A by way of signal path 70 and, in response thereto, provides a correction signal by way of signal path 72 to the actuator coil 36 in order to position the heads 28A, 28B with respect to the discs 18A, 18B. The actuator coil 36 interacts with the permanent magnet 38 of the VCM 34 as described hereinabove. As will be recognized, in a dedicated servo system the head 28A would comprise a servo head, dedicated to providing generally continuous servo positioning information to the servo control circuit 54 with the corresponding surface of the disc 18A serving as a dedicated servo surface. In such a dedicated servo system, the remaining heads (28B being the only other head shown in FIG. 2) would comprise data heads and would be used to transfer dam to and from the remaining discs during write and read operations, respectively.

Alternatively, it will be recognized that in an embedded servo system, each of the heads 28A, 28B would serve as both servo and data heads, with both servo information and data being stored on the tracks of the discs 18A, 18B. In an embedded servo system, functional connections would generally be provided from each of the heads 28A, 28B to the servo control circuit 54 as well as to the read/write channel 52. However, it will be recognized that the present invention does not depend on the use of a particular type of servo system. For more discussion regarding the construction and operation of a typical dedicated servo control circuit, see U.S. Pat. No. 5,262,907 entitled HARD DISC DRIVE WITH IMPROVED SERVO SYSTEM, issued Nov. 16, 1993 to Duffy, McKenzie, Heydari and Woods, assigned to the assignee of the present invention and incorporated herein by reference.

Finally, the read/write channel 52 passes data to be written to and read from the disc 18B, respectively, by way of signal path 74 and the head 28B. That is, in response to a write command received by the system microprocessor 60 from the host computer 50 (by way of a command bus 76), the system microprocessor 60 controls the flow of data to be written to disc from the host computer 50 to the interface circuit 62 (by way of an external data bus 78) and from the interface circuit 62 to the read/write channel 52 (by way of the internal data bus 64). The read/write channel 52, in turn, provides a write current to the head 28B by way of the path signal 74 in order to write the data by selectively magnetizing selected data tracks on the disc 18B.

Likewise, in response to a read command from the host computer 50, the head 28B detects flux transitions from the selected data tracks on the disc 18B and provides an analog read signal to the read/write channel 52, which in turn converts the analog read signal to digital form and performs the necessary decoding operations to provide data to the interface circuit 62 for output to the host computer 50. In controlling these various operations of the disc drive 10, the system microprocessor 60 includes the use of programming stored in system microprocessor RAM 80.

Having concluded an overview of the disc drive functional block diagram of FIG. 2, reference is now be made to FIG. 3, which shows a functional block diagram of the read/write channel 52 of FIG. 2, operably connected to the head 28B. For purposes of disclosure, the read/write channel 52 is contemplated as employing PRML signal processing techniques, although as will be recognized the present invention is not so limited.

The read/write channel 52 includes an encoder circuit 82 which, upon receipt of data from the interface circuit 62 by way of the internal data bus 64, encodes the data with run length-limited and ECC encoding. The encoded data is provided to a write controller 84, which serializes the encoded data and provides a time-varying write current to the head 28B to write the encoded data when the head 28B is over the desired sector on the disc 18B.

At such time that the data is to be subsequently read from the disc 18B and provided to the host computer 50 (of FIG. 2), the head 28B is moved to the selected dam track. Once the sector containing the data passes under the head 28B, the head 28B outputs a read signal indicative of the encoded data that was previously written to the sector. Particularly, the head 28B detects flux transitions from the selective magnetization of the sector and provides the read signal to a preamp 86, which amplifies the signal (as will be recognized, the preamp 86 can be incorporated as part of the flex circuit assembly 40 of FIG. 1). A prefilter 88 preforms preliminary frequency domain filtering of the preamplified read signal to reduce the effects of noise and the filtered read signal is then provided to an equalizer circuit 90. As disclosed in U.S. Pat. No. 5,592,340 entitled COMMUNICATION CHANNEL WITH ADAPTIVE ANALOG TRANSVERSAL EQUALIZER issued Jan. 7, 1997 by Minuhin et al., assigned to the assignee of the present invention and incorporated herein by reference, the equalizer circuit 90 performs time-domain equalization of the read signal to filter the signal to an approximation of a waveform used with a selected class of partial response signaling (such as class PR-IV). As will be recognized, such equalization allows intersymbol interference (ISI) from adjacent bits in the read signal to be controlled, allowing recovery of the initial data sequence written to disc to be detected from the equalized signals output from the equalizer circuit 90.

The equalizer circuit 90 operates in response to tap weights (not shown) supplied to the equalizer circuit 90 from, for example, the system microprocessor 60. Although an analog transversal equalizer circuit 90 has been represented in FIG. 3, digital synchronous equalizers are also well known in the art; see for example, U.S. Pat. No. 5,422,760 entitled DISK DRIVE METHOD USING ZONED DATA RECORDING AND PRML SAMPLING DATA DETECTION WITH DIGITAL ADAPTIVE EQUALIZATION, issued Jun. 6, 1995 to Abbott et al.

Continuing with FIG. 3, the equalized output signal is provided to a detection circuit 92, wherein the equalized output signal is sampled and the samples are used to reconstruct the encoded data that was written to the sector. The detection circuit 92 includes the use of a maximum likelihood detector and a timing circuit, examples of which are disclosed in U.S. Pat. No. 5,430,768 entitled IMPROVED MAXIMUM LIKELIHOOD DETECTOR FOR A DISC DRIVE PRML READ CHANNEL, issued Jul. 4, 1995 to Minuhin et al. and U.S. Pat. No. 5,459,757 entitled TIMING AND GAIN CONTROL CIRCUIT FOR A PRML READ CHANNEL, issued Oct. 17, 1995 to Minuhin et al. Both of these references are assigned to the assignee of the present invention and are incorporated herein by reference.

Once the encoded data is reconstructed, conventional ECC circuitry (not separately shown) operates to detect and correct read errors in the data and to provide an indication to the system microprocessor 60 (of FIG. 2) where uncorrected read errors are present in the retrieved data. At such time that no read errors are detected, or those errors that are detected are corrected by the ECC circuitry, the retrieved user data is output by the detection circuit 92 to the interface circuit 62 (of FIG. 2) for subsequent transfer to the host computer 50.

Figure 4:
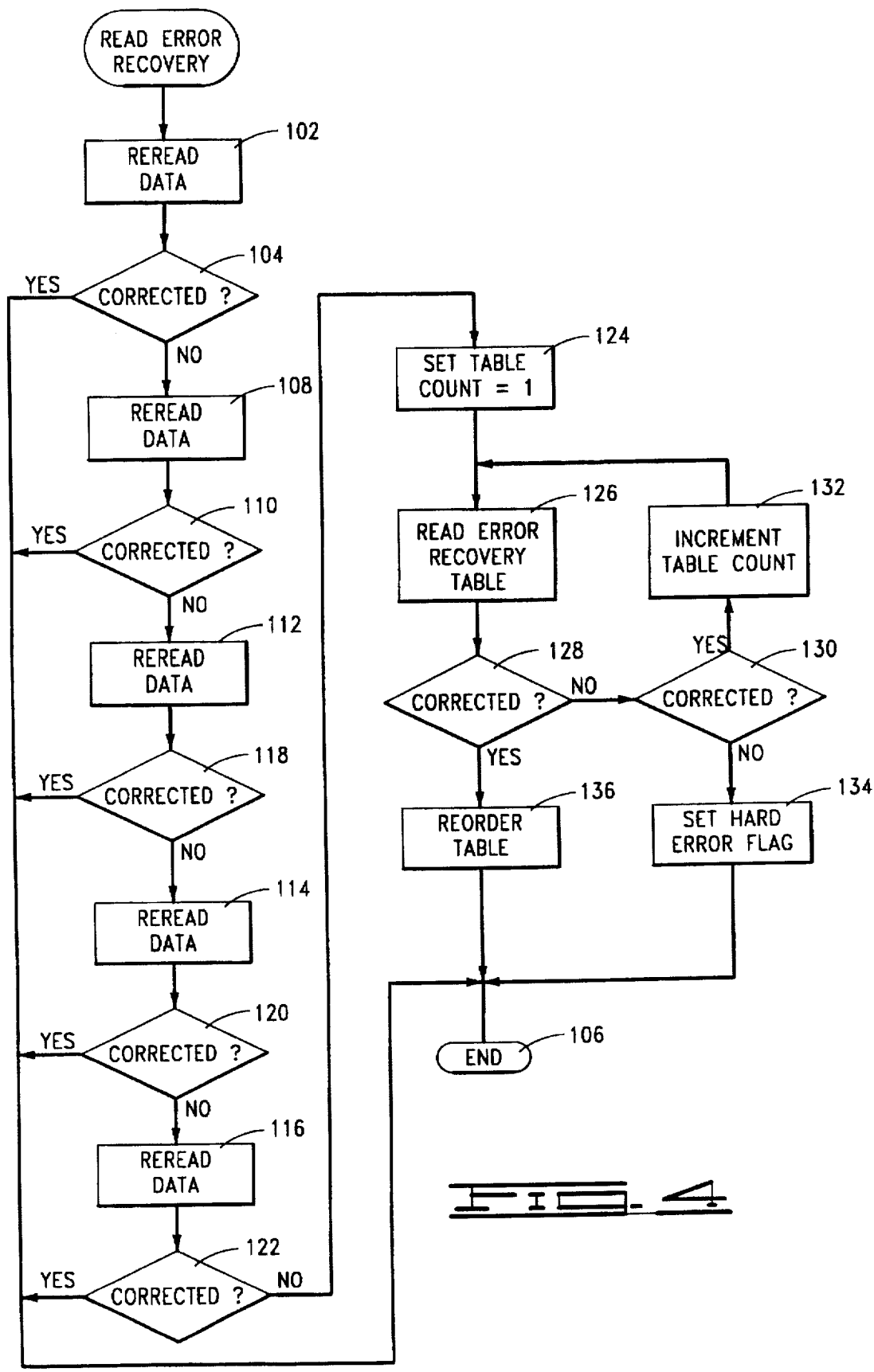
FIG. 4 is a generalized flow chart for a READ ERROR RECOVERY routine performed by the system microprocessor of FIG. 2 in response to a read error reported by the read/write channel of FIG. 3.

Having concluded a discussion of the general construction and operation of the read/write channel 52 of FIG. 3, attention is now directed to FIG. 4 which provides a generalized flow chart of steps performed by the disc drive 10 in accordance with the present invention. More particularly, FIG. 4 identifies a READ ERROR RECOVERY routine, which represents a routine stored in the form of programming in the RAM 80 and used by the system microprocessor 60 when uncorrected read errors are detected by the read/write channel 52.

As an overview, the READ ERROR RECOVERY routine generally operates in response to an uncorrected read error by first providing a series of "free retries", wherein the data containing the uncorrected read error is reread a number of times. Should the free retries result in the correction of the read error, the disc drive 10 continues normal operation and the routine ends.

However, when the free retries do not result in the correction of the read error, the routine advances to a READ ERROR RECOVERY TABLE, containing a sequentially ordered set of corrective operations. Each of the corrective operations are performed in order, until either the read error is resolved or the table is exhausted. Should the table be exhausted without correction of the error, the disc drive 10 sets a hard error flag, notifies the host computer 50 of the error condition and takes other suitable action, such as marking the sector containing the uncorrectable error as a "bad sector". On the other hand, should a corrective operation from the table correct the error, the table is reordered so that the corrective operation which corrected the error is advanced one location in the table. In this manner, the table is continually adapted to the performance of the drive, optimizing the operation of the drive and minimizing the time required to correct read errors.

Turning now to FIG. 4, the READ ERROR RECOVERY routine begins at step 102, wherein the system microprocessor 60 instructs the read/write channel 52 to perform the first free retry by rereading the data containing the uncorrected error. It will be recognized that this first free retry requires the disc 18B to complete one full revolution until the sector containing the data again passes under the head 18B, after which the read/write channel 52 operates as described above to retrieve the data stored on the sector. As indicated by decision block 104, if the first free retry corrects the error, the flow of the READ ERROR RECOVERY routine ends at block 106. However, if the first free retry does not correct the read error, the second free retry is performed at block 108 (and checked by decision block 110) in an attempt to eliminate the read error a second time. If unsuccessful, the flow of the routine continues in like fashion through the remaining free retry blocks 112, 114 and 116 (and corresponding decision blocks 118, 120 and 122). It will be recognized that the routine of FIG. 4 includes five free retries, but another number of retries could readily be used, as desired.

At such time that the free retries are unsuccessful in correcting the read error, the READ ERROR RECOVERY routine proceeds the second portion of the routine, wherein a READ ERROR RECOVERY TABLE is used in an attempt to correct the error. Particularly, FIG. 5 illustrates a preferred construction for the READ ERROR RECOVERY TABLE used by the routine of FIG. 4.

Figure 5:
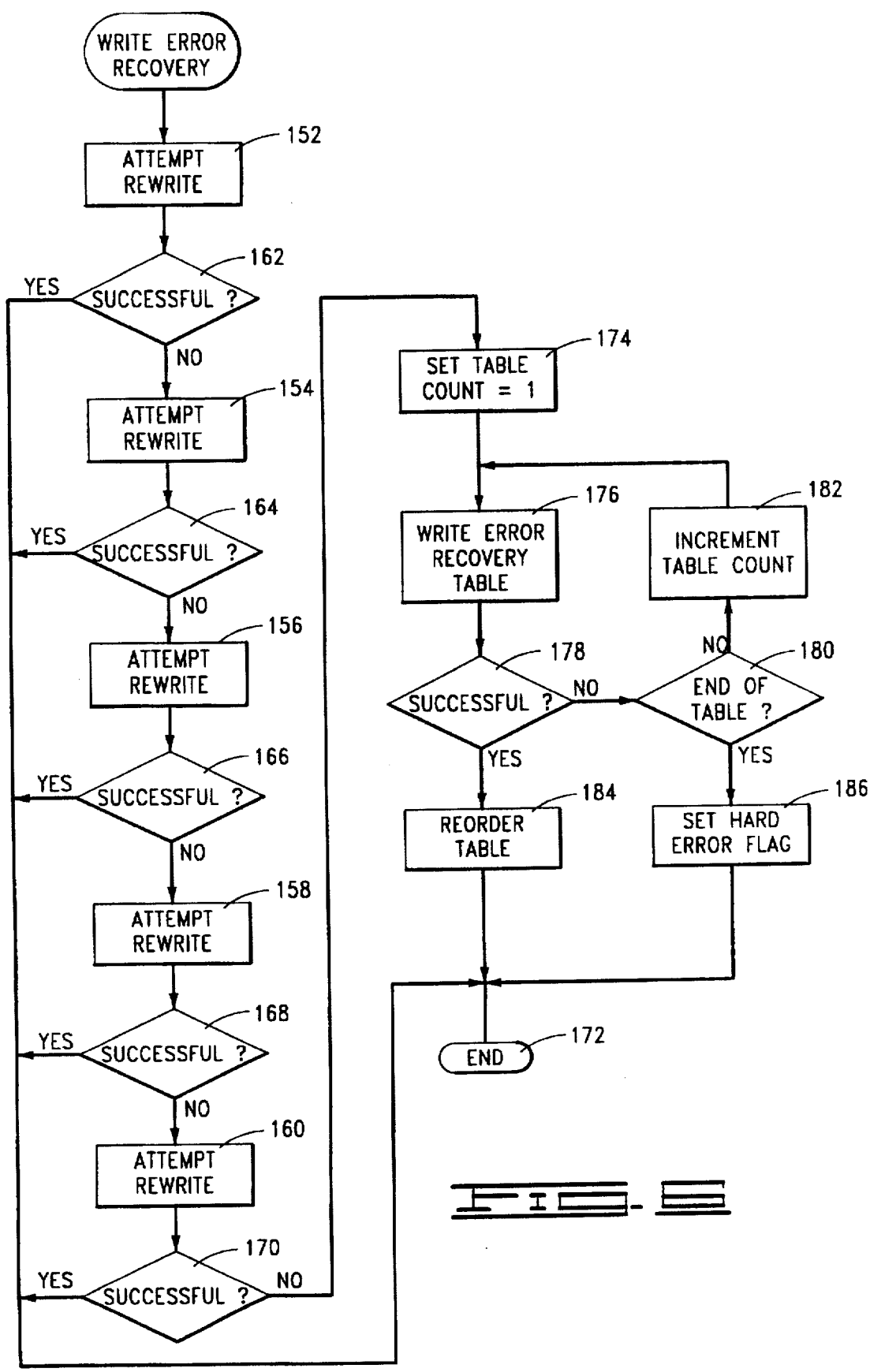
FIG. 5 is a generalized representation of a READ ERROR RECOVERY TABLE utilized by the routine of FIG. 4.

As shown in FIG. 5, the table preferably comprises an ordered sequence of 17 corrective operations, each with a corresponding table count, so that each of the corrective operations are performed in order until either the table is exhausted or the error is corrected. It will be recognized that a variety of corrective operations can be used as desired depending upon the design and performance of a particular disc drive; thus, the corrective operations shown in FIG. 5 are provided for purposes of disclosure, but are not limiting. However, before returning to a discussion of the routine of FIG. 4, it may be useful to first discuss each of the corrective operations identified in FIG. 5.

Referring to FIG. 5, the first corrective operation is shown to be a "SEEK AWAY", which comprises performing a one-track seek of the head 28B away from the selected track containing the data to an adjacent destination track, returning the head 28B to the selected track, and then performing a reread of the data when the sector containing the data passes under the head 28B. As will be recognized, such seek away operations have been found to be effective in the elimination of read errors caused by misalignment of the head 28B over the selected track as a result of, for example, a servo offset. Of course, the seek could be to a destination track other than a track adjacent to the selected track.

Continuing with the table of FIG. 5, the second and third corrective operations identified therein are "REREAD DATA" operations, which as will be recognized comprise rereading the data without other changes to the system; that is, the reread data operations are similar to the free retries discussed above.

The fourth corrective operation is identified as an "ADAPT READ CHANNEL" operation, which as will be recognized requires adaptation of the read channel parameters used by the read/write channel 52. Particularly, the preferred embodiment contemplates adaptation of the tap weights used by the equalizer circuit 90 as a result of the ADAPT READ CHANNEL operation, although other parameters used by the read channel could readily be adapted, as desired. The manner in which read channel adaptation can be accomplished is well understood by those skilled in the art and is discussed by the preceding Minuhin and Abbott references. Thus, additional discussion concerning adaptation of the read channel will not specifically be provided herein.

The fifth, sixth, seventh and eighth corrective operations are identified as "CHANGE ECC LEVEL" operations, which comprise using a different level of ECC decoding to correct reported errors in the retrieved data. As discussed in the previously incorporated Shaver and Deng references, ECC encoding is performed by appending a number of code bits to the end of each selected portion of data bits (such as each byte) to generate encoded words that mathematically map into a Galois field. That is, the code bits are added to the data bits so that the total bits in an encoded word can be considered to be the coefficients of a polynomial having defined roots, so that only mathematically defined combinations (encoded words) can exist. When an encoded word is retrieved, the word is compared to the set of defined combinations, so that encoded words containing read errors will generally not map into the set of defined combinations; thus, based upon the algorithm used by the ECC circuitry, illegal combinations can be detected and up to a selected number of the bits in such words can be changed in order to correct the presence of read errors therein. Once corrected, the code bits are thereafter stripped, allowing the originally recorded data bits to be output to the host computer 50.

As will be recognized, different algorithms, or levels of ECC correction, can be used with the same encoding scheme to detect and correct different numbers of errors in the retrieved encoded words, or to provide different probabilities of detection and correction. Risks associated with ECC correction generally include both the unnecessary correction of correct data and the non-detection of read errors in the retrieved data. Thus, an optimal level of ECC correction is typically chosen which balances the number of correctable errors, the probability of miscorrection of errors and the probability of misdetection of errors. This optimal level is generally then used by the ECC circuitry during normal operation of the read/write channel 52; however, it will be recognized that a different level of ECC correction can be advantageous in some cases. Thus, based upon the foregoing, the "CHANGE ECC LEVEL" corrective operation entails rereading the data using a different level of ECC correction in order to correct the erroneous data.

Continuing with FIG. 5, the ninth and tenth corrective operations in the table are identified as "+6% OFF TRACK CENTER". These operations comprise repositioning the head 28B so that the head 28B is moved away from the center of the track by a distance equal to 6% of the total track width in the "positive" direction, as established by the servo control circuit 54. For reference, it is contemplated that movement of the head 28B towards the inner diameter of the disc 18B is considered to be in the positive direction, whereas movement towards the outer diameter of the disc 18B is considered to be in the negative direction. As will be recognized, adjusting the head 28B so as to be off track center can result in the correction of read errors that occur, for example, from data not written exactly in the center of the track, or read errors that occur due to interference from the magnetization of adjacent tracks.

Likewise, the eleventh and twelfth corrective actions in the table of FIG. 5 provide "−6% OFF TRACK CENTER", which comprise the repositioning of the head 28B by 6% from track center in the negative direction. Moreover, the thirteenth and fourteenth and the fifteenth and sixteenth corrective actions call for "+12% OFF TRACK CENTER" and "−12% OFF TRACK CENTER", respectively. Although the distances of ±6% and ±12% have been found to be advantageous in particular applications, depending upon the configuration of a particular disc drive, distances other than ±6% and ±12% can be readily used as desired.

Finally, the seventeenth corrective action is identified as a "WIGGLE RETRY", which comprises repositioning the head 28B over a non-data, user track (such as located at an inner or an outer diameter of the disc 18B outside of the band used to record data) and writing a preselected pattern of bits to this track. After writing to the non-user data track, the head 28B is returned to the selected track and the data is reread. As will be recognized, the WIGGLE RETRY can correct read errors that occur as a result of domain instability in the thin film elements of the head 28B.

Having concluded a discussion of the various corrective actions listed in the READ ERROR RECOVERY TABLE of FIG. 5, the discussion will now return to the READ ERROR RECOVERY routine of FIG. 4. As provided hereinabove, when the free retries do not correct the error, the routine continues at block 124, wherein a TABLE COUNT value is set equal to 1. The routine then passes to block 126, wherein the corrective operation from the READ ERROR RECOVERY TABLE (of FIG. 5) corresponding to the TABLE COUNT value is performed. Thus, as a result of the operation of block 124, the first corrective operation (SEEK AWAY) will be performed by the routine of FIG. 4.

After the operation of block 126, the routine continues at decision block 128, wherein the system microprocessor 60 determines whether the corrective operation was successful in correcting the read error. If not, the routine passes as shown to a decision block 130, which determines whether the table has been exhausted; that is, all of the corrective operations in the table have been performed. If not, the TABLE COUNT value is incremented by block 132 and the next corrective operation in the table is performed.

At such time that the table is exhausted without the read error having been corrected, the flow of the routine passes from the decision block 130 to block 134, wherein a hard error flag is set (as well as other suitable actions, such as the marking of the sector as a bad sector). The routine then ends at block 106. However, when a selected one of the corrective operations of the table result in the correction of the read error, the flow passes from decision block 128 to block 136, wherein the table of FIG. 5 is reordered. That is, the selected operation that resulted in correction of the read error is advanced one table count in the table. For purposes of illustration, assuming the table is ordered as shown in FIG. 5 during operation of the routine of FIG. 4 and the ADAPT READ CHANNEL (table count=4) operation corrects the read error, the operation of block 136 would cause the ADAPT READ CHANNEL operation to advance in the table ahead of the preceding REREAD DATA operation (table count=3) so that, upon reordering of the table, the ADAPT READ CHANNEL operation would have a resulting table count of 3 and the REREAD DATA operation would have a resulting table count of 4.

The routine of FIG. 4 operates to continuously adapt the recovery process to the conditions causing the occurrence of read errors, so that the recovery process is optimized as the most effective corrective operations "filter" towards the top of the table of FIG. 5. Although alternative reordering schemes are contemplated, such as sequentially moving each successful corrective operation to the top of the table, the weighting effect that occurs over time from the advancement of each successful corrective operation just one position in the table has been found to be advantageous.

Having concluded the discussion of FIGS. 4 and 5, the discussion will now focus on the manner in which the present invention optimizes the write error recovery process. As with the read error recovery process described above, the write error recovery process makes use of a WRITE ERROR RECOVERY routine, as shown in FIG. 6, and a WRITE ERROR RECOVERY TABLE, as shown in FIG. 7, with the routine and table representative of programming stored in RAM 80 and used by the system microprocessor 60 when a write error is reported by the write controller 84.

Beginning with FIG. 6, the WRITE ERROR RECOVERY routine first attempts a series of free retries, wherein a number of rewrite operations are attempted upon receipt of a write error. Particularly, FIG. 6 includes ATTEMPT REWRITE blocks 152, 154, 156, 158 and 160, and corresponding decision blocks 162, 164, 166, 168 and 170. Thus, as shown in FIG. 6 the occurrence of a write error results in five free retries, in which the head 28B attempts to rewrite the data to the selected sector during five consecutive rotations of the disc 18 as the selected sector passes under the head 28B. Should the data be successfully written during the course of these free retries, the routine ends at block 172 and normal disc drive operation resumes.

At such time that the free retries are unsuccessful, however, the routine of FIG. 6 proceeds to utilize the WRITE ERROR RECOVERY TABLE of FIG. 7 in the write error recovery process. As with the READ ERROR RECOVERY TABLE of FIG. 5, the table of FIG. 7 comprises a plurality of corrective operations that are sequentially performed in an attempt to correct the write error. Referring to FIG. 7, the WRITE ERROR RECOVERY TABLE has corrective operations identified as "ATTEMPT REWRITE" at table counts of 1–4, 6, 8–10 and 12–13. The ATTEMPT REWRITE is similar to the free retries discussed hereinabove in that the write controller 84 attempts to rewrite the data to the selected sector without other changes to the system. It will be recognized that during a write operation it is desirable to limit the movement of the head 28B as much as possible, due to the risk of writing data to locations other than to the desired sector and corrupting data previously stored on the disc 18B. Thus, a majority of the corrective operations shown in the table of FIG. 7 are preferably attempts to rewrite the data without attendant commands to reposition the head 28B.

Additionally, the table of FIG. 7 provides "SEEK AWAY", "ADAPT READ CHANNEL" and "WIGGLE RETRY" operations (at the fifth, seventh and eleventh table counts, respectively). These operations are performed as described hereinabove with reference to the table of FIG. 5.

Continuing now with the routine of FIG. 6, when the free retries are unsuccessful in correcting the write error, the routine continues at block 174, wherein the TABLE COUNT value is set equal to 1. The WRITE ERROR RECOVERY TABLE is then initiated at block 176 and the first corrective operation found therein (ATTEMPT REWRITE, as shown in FIG. 7) is performed. Should this first corrective operation be unsuccessful, a decision block 178 will pass the routine flow to a decision block 180, which checks whether the table has been exhausted. If not, the TABLE COUNT is incremented and the next corrective operation in the table is performed.

Should during the operation of the routine a selected corrective operation result in the resolution of the write error, the flow of FIG. 6 will pass from the decision block 178 to block 184, wherein the table is reordered; that is, the selected corrective operation is advanced one location in the table. Alternatively, should the table be exhausted without resolution of the error, the decision block 180 passes the flow to block 186, wherein a hard error flag is set, indicative of a hard write error. The disc drive 10 will also take other suitable actions in response to the hard write error, such as notifying the host computer 50 of the situation.

It will be recognized that the operation of the routine of FIG. 6 will adapt the write error recovery process in response to the conditions causing the occurrence of write errors, thereby optimizing the write error recovery process. As with the READ ERROR RECOVERY TABLE, the WRITE ERROR RECOVERY TABLE is preferably reordered as discussed hereinabove, with the advancement of each successful corrective operation one location in the table; however, other methodologies, such as advancing each successful corrective operation to the top of the table, are contemplated. Additionally, the corrective operations listed in the table of FIG. 7 are provided for purposes of disclosure and are not limiting, so that other suitable corrective operations could be used with such a table in the write error recovery process.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A method-for optimizing read/write channel error recovery in a disc drive including a rotatable disc having a plurality of data tracks including sectors for storage and retrieval of data, a head controllably positionable with respect to the tracks and a read/write channel for passing signals to and from the head during write and read operations wherein data is stored on and retrieved from the sectors on the disc, the read/write channel providing an indication when an error occurs during the write and read operations, the method comprising the steps of:

providing a table of sequentially ordered corrective operations, each corrective operation having a corresponding table count;

sequentially performing the corrective operations in response to an error until a selected corrective operation having a selected table count corrects the error, wherein the corrective operations are sequentially performed in accordance with the corresponding table counts; and reordering the table so that the selected corrective operation is advanced in the table and provided with a new table count less than the selected table count.

2. The method of claim 1, further comprising the step of performing a free retry to correct the error before performing the step of sequentially performing the corrective operations in the table.

3. The method of claim 1, wherein the corrective operations include a seek away operation wherein the head is moved away from a selected track comprising a selected sector associated with the error to a destination track and then back to the selected track in an attempt to correct the error.

4. The method of claim 1, wherein the corrective operations include an adapt read channel operation wherein selected parameters in the read/write channel are adapted.

5. The method of claim 1, wherein the corrective operations include a wiggle retry operation wherein the head is repositioned over a non-user data track, a selected pattern of data is written to the non-user data track, and the head is thereafter returned to a position over the selected track.

6. The method of claim 1, wherein the error is a read error and the corrective operations include maintaining the head proximate to the selected track while repositioning the head off of track center by a selected percentage of the track width.

7. The method of claim 6, wherein the corrective operations include a change in the level of error correction circuitry detection employed by the read/write channel.

8. The method of claim 1, further comprising the steps of setting a hard error flag at such time that the table is exhausted without correction of the error.

9. An improved disc drive of the type having a rotatable disc and an actuator adjacent to the disc, the actuator including a controllably positionable head, the disc drive including a read/write channel for the passage of signals to and from the head during write and read operations wherein data is stored and retrieved from sectors on tracks on the disc, the read/write channel providing indications when errors occur during said write and read operations, the disc drive further including a system microprocessor with associated memory for controlling selected operations of the disc drive, the improvement comprising:

error recovery means for recovering from a read/write channel error comprising:

sequence means for performing a sequence of corrective operations in response to the error; and reordering means for reordering the sequence of corrective operations when a selected one of the corrective operations corrects the error, wherein the selected corrective operation is advanced in the sequence.

10. The improvement of claim 9, wherein the error recovery means comprises programming stored in memory and performed by the system microprocessor.

11. The improvement of claim 9, further comprising free retry means for performing a free retry to correct the error before performing the sequence of corrective operations.

12. The improvement of claim 9, wherein the sequence of corrective operations include a seek away operation wherein the head is moved away from a selected track comprising a selected sector associated with the error to a destination track and then back to the selected track in an attempt to correct the error.

13. The improvement of claim 9, wherein the sequence of corrective operations include an adapt read channel operation wherein selected parameters in the read/write channel are adapted.

14. The improvement of claim 9, wherein the sequence of corrective operations include a wiggle retry operation wherein the head is repositioned over a calibration track, a selected pattern of data is written to the calibration track, and the head is thereafter returned to a position over the selected track.

15. The improvement of claim 9, wherein the error is a read error and the sequence of corrective operations include maintaining the head proximate to the selected track while repositioning the head off of track center by a selected percentage of the track width.

16. The improvement of claim 15, wherein the sequence of corrective operations include a change in the level of error correction circuitry detection employed by the read/write channel.

17. The improvement of claim 9, further comprising error means for setting a hard error flag at such time that the sequence is completed without correction of the error.

* * * * *

UNITED STATES PATENT AND TRADEMARK OFFICE
CERTIFICATE OF CORRECTION

PATENT NO.   : 5,721,816
DATED        : February 24, 1998
INVENTOR(S)  : Kusbel et al.

It is certified that error appears in the above-identified patent and that said Letters Patent is hereby corrected as shown below:   On the title page: Item [75]

inventors' section, delete "Ohio" and insert —Okla.—.

Column 5, line 48, delete "dam" and insert —data—.

Column 8, line 57, delete "dam" and insert —data—.

Column 11, line 33, start a new paragraph with 'Referring to FIG. 7.'

Signed and Sealed this

Tenth Day of November 1998

Attest:

BRUCE LEHMAN

Attesting Officer

Commissioner of Patents and Trademarks